US007045836B2

(12) United States Patent
Lee et al.

(10) Patent No.: US 7,045,836 B2
(45) Date of Patent: May 16, 2006

(54) SEMICONDUCTOR STRUCTURE HAVING A STRAINED REGION AND A METHOD OF FABRICATING SAME

(75) Inventors: Wen-Chin Lee, Hsin-Chu (TW); Chung-Hu Ge, Taipei (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 98 days.

(21) Appl. No.: 10/657,616

(22) Filed: Sep. 8, 2003

(65) Prior Publication Data
US 2005/0023576 A1 Feb. 3, 2005

Related U.S. Application Data

(60) Provisional application No. 60/491,602, filed on Jul. 31, 2003.

(51) Int. Cl.
*H01L 21/00* (2006.01)

(52) U.S. Cl. ............... 257/288; 259/593; 259/347

(58) Field of Classification Search ............ 257/288, 257/194, 347, 349, 593
See application file for complete search history.

(56) References Cited

U.S. PATENT DOCUMENTS

| | | | | |
|---|---|---|---|---|
| 4,927,471 A | * | 5/1990 | Okuda | ............... 148/33.5 |
| 5,221,367 A | | 6/1993 | Chisholm et al. | |
| 5,256,550 A | * | 10/1993 | Laderman et al. | ........... 438/509 |
| 5,801,083 A | | 9/1998 | Yu et al. | |
| 5,817,566 A | * | 10/1998 | Jang et al. | ............... 438/424 |
| 6,039,803 A | | 3/2000 | Fitzgerald et al. | |
| 6,107,653 A | | 8/2000 | Fitzgerald | |
| 6,245,684 B1 | | 6/2001 | Zhao et al. | |
| 6,291,321 B1 | | 9/2001 | Fitzgerald | |
| 6,429,061 B1 | | 8/2002 | Rim | |
| 6,503,773 B1 | | 1/2003 | Fitzgerald | |
| 6,509,232 B1 | | 1/2003 | Kim et al. | |
| 6,518,644 B1 | | 2/2003 | Fitzgerald | |
| 6,544,860 B1 | | 4/2003 | Singh | |
| 6,566,224 B1 | * | 5/2003 | Chang et al. | ............... 438/424 |
| 6,579,768 B1 | | 6/2003 | Thwaite et al. | |
| 6,583,020 B1 | * | 6/2003 | Uhlig et al. | ............... 438/387 |
| 6,597,026 B1 | | 7/2003 | Ogura | |
| 6,787,423 B1 | * | 9/2004 | Xiang | ................ 438/296 |
| 6,858,502 B1 | * | 2/2005 | Chu et al. | ................... 438/285 |
| 6,876,010 B1 | * | 4/2005 | Fitzgerald | ................... 257/191 |
| 2002/0090772 A1 | * | 7/2002 | Higashi | .................... 438/166 |

(Continued)

OTHER PUBLICATIONS

Schlueter, J., "Trench Warfare: CMP and Shallow Trench Isolation," Semiconductor International, Oct. 1999.

(Continued)

*Primary Examiner*—Laura M. Schillinger
(74) *Attorney, Agent, or Firm*—Slater & Matsil, L.L.P.

(57) ABSTRACT

A semiconductor structure including a highly strained selective epitaxial top layer suitable for use in fabricating a strained channel transistor. The top layer is deposited on the uppermost of a series of one or more lower layers. The lattice of each layer is mismatched with the lattice of its subjacent layer by an amount not less than the lattice mismatch between the lowest layer of the series and a substrate on which it resides. A trench is formed in the uppermost series layer. The trench has rounded corners so that a dielectric material filling the trench conforms to the round corners. The rounded corners are produced by heating the uppermost series layer after trench formation.

15 Claims, 2 Drawing Sheets

U.S. PATENT DOCUMENTS

| | | | |
|---|---|---|---|
| 2002/0125475 A1* | 9/2002 | Chu et al. | 257/55 |
| 2003/0034529 A1 | 2/2003 | Fitzgerald et al. | |
| 2003/0049893 A1 | 3/2003 | Currie et al. | |
| 2004/0164373 A1* | 8/2004 | Koester et al. | 257/499 |
| 2004/0221792 A1* | 11/2004 | Forbes | 117/4 |
| 2004/0232422 A1* | 11/2004 | Forbes | 257/63 |
| 2004/0235264 A1* | 11/2004 | Forbes | 438/429 |
| 2005/0023576 A1* | 2/2005 | Lee et al. | 257/288 |
| 2005/0032340 A1* | 2/2005 | Takizawa | 438/489 |
| 2005/0035426 A1* | 2/2005 | Ko et al. | 257/510 |

OTHER PUBLICATIONS

Taraschi, G., "Strained Si-on-Insulator Development Accelerates," Compound Semiconductor, Apr. 2003.

* cited by examiner

SEMICONDUCTOR STRUCTURE HAVING A STRAINED REGION AND A METHOD OF FABRICATING SAME

This application claims priority to provisional patent application Ser. No. 60/491,602, entitled "Semiconductor Structure having a Strained Region and a Method of Fabricating Same, "filed on Jul. 31, 2003, which application is incorporated herein by reference.

TECHNICAL FIELD

The present invention relates to a semiconductor structure having a strained region, the structure being usable for the fabrication of a strained channel semiconductor transistor or other device, and to a method of fabricating such a structure.

BACKGROUND

It has been known for some time that high electron and hole mobility in transistors, such as MOSFETs, may be achieved through the use of strained silicon or other layers epitaxially grown on relaxed SiGe or other layers. It has been demonstrated that the strained layers are eminently suitable as channel regions of transistors such as MOSFETs, and result in devices having enhanced performance. It has also been shown that strained layers must not be exposed to overly high temperatures during MOSFET fabrication procedures. Temperatures that are too high may relax or "unstrain" the strained layers, decreasing or eliminating the high electron and hole mobility. Moreover, ion implantation procedures typically used in MOSFET fabrication may damage the strained layers, thereby compromising the advantages that might otherwise be realized from the presence of the strained material. See U.S. Pat. No. 6,518,644 to Fitzgerald, issued Feb. 11, 2003; U.S. Pat. No. 6,429,061 to Rim, issued Aug. 6, 2002; and U.S. Pat. No. 6,291,321 to Fitzgerald, issued Sep. 18, 2001. See also Gianni Taraschi, "Strained Si-on-Insulator Development Accelerates," Compound Semiconductor, April, 2003.

The desirability of using shallow trench isolation ("STI") in fabricating MOSFETs generally, and MOSFETS having strained channels specifically, is known. See published U.S. Patent Application 2003/0049893, by Currie et al., filed Jun. 7, 2002 and Jim Schlueter, "Trench Warfare: CMP and Shallow Trench Isolation," Semiconductor International, Oct. 1, 1999.

Studies of prior art devices and their methods of fabrication generally have shown that sharp (~90°) top and bottom corners of isolation trenches with vertical or near vertical sidewalls are deleterious to the reliability of transistors such as MOSFETs, as well as other electrical devices, that incorporate them. Rounding of these corners during MOSFET fabrication (or, less desirably, covering the sharp corners with rounded oxides) has been the goal of previous efforts. See U.S. Pat. No. 6,597,026 to Ogura, issued Jul. 22, 2003 (top trench corners rounded by thermal oxidation); U.S. Pat. No. 6,579,768 to Thwaite, et al., issued Jun. 17, 2003 (top trench corners rounded by thermal oxidation); U.S. Pat. No. 6,544,860 to Singh, issued Apr. 8, 2003 (bottom trench corners rounded by exposure to $SF_6$); U.S. Pat. No. 6,509,232 to Kim, et al., issued Jan. 21, 2003 (top trench corners rounded by thermal oxidation); U.S. Pat. No. 6,245,684 to Zhao, et al., issued Jun. 12, 2001 (top trench corners rounded by isotropic etch of silicon exposed by undercutting superjacent layer); and U.S. Pat. No. 5,801,083 to Yu, et al., issued Sep. 1, 1998 (top trench corners rounded by thermal oxidation).

SUMMARY OF THE INVENTION

Preferred product aspects of the present invention contemplate a semiconductor structure, particularly a strained semiconductor structure suitable for use in the fabrication of a strained channel transistor, such as a MOSFET. More specifically, a preferred embodiment of the present invention relates to a multilayered semiconductor structure having a strained region, which structure is usable in fabricating a strained channel transistor, particularly a MOSFET, having isolation trenches, preferably trenches effected by shallow trench isolation ("STI") techniques, which structure is made under conditions, and which otherwise possesses a topography, that result in low defects and enhanced performance of the ultimate transistor fabricated therefrom.

In one aspect, the invention provides for a semiconductor structure from which a strained channel transistor may be fabricated. The structure includes a semiconductor substrate and a series of N epitaxial layers, an initial layer of the series being on, and having a lattice mismatched with, the lattice of the substrate. Each successive layer is on a previous layer and the Nth layer is the uppermost layer. The structure further includes an isolation trench having rounded corners formed in the uppermost Nth layer and insulative material filling the trench. The structure further includes a selective top epitaxial layer on the Nth layer of the series.

In another aspect, the present invention provides for a semiconductor structure from which a strained channel transistor may be fabricated, including a semiconductor substrate, a first epitaxial layer on the substrate, and a second epitaxial layer on the first layer. The structure further includes an isolation trench having rounded corners formed in the second layer, an insulative material filling the isolation trench, and a selective top epitaxial layer on the second layer.

In yet another aspect, the present invention provides for a method of making a semiconductor structure from which a strained channel transistor may be fabricated. The method includes depositing a series of N epitaxial layers. The initial layer of the series is on a semiconductor substrate and each higher layer is on the previous layer, with the Nth layer being the uppermost layer of the series. Each layer of the series has an equal or higher mismatch with the lattice of the substrate than the previous layer. The method further includes forming a trench having rounded corners in the Nth layer and filling the trench with an insulative material. The method further includes depositing a selective epitaxial top layer on the Nth layer, the top layer having equal or higher mismatch with the lattice of the substrate than the Nth layer.

In general terms, embodiments of the present invention contemplate a multi-layer structure having a series of N layers on a substrate (N is equal to or greater than 1) with the top layer residing on the uppermost Nth layer. The lattice of the initial layer of the series is mismatched with that of the substrate, and each higher layer is mismatched with the lattice of the substrate by an amount no less than the lattice mismatch between the immediately lower layer and the substrate. The trench is formed in the uppermost Nth layer of the series, which is thereafter processed as described above with reference to the second layer. Where N=1, as in the previous paragraph, the "initial layer" of the series and the "top layer" are the same layer and the trench is formed therein.

In alternative embodiments, the trench is first formed in the Nth layer, which may be the second or first layer in previously described embodiments, followed by corner rounding effected during annealing of the Nth layer. The Nth layer may be planarized before trench formation. The top layer is then deposited on the free surface of the Nth layer, after which the trench is filled with dielectric material. In its method aspects, the present invention contemplates methods of making the semiconductor structure described above.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

DETAILED DESCRIPTION OF ILLUSTRATIVE EMBODIMENTS

Figure 1A:
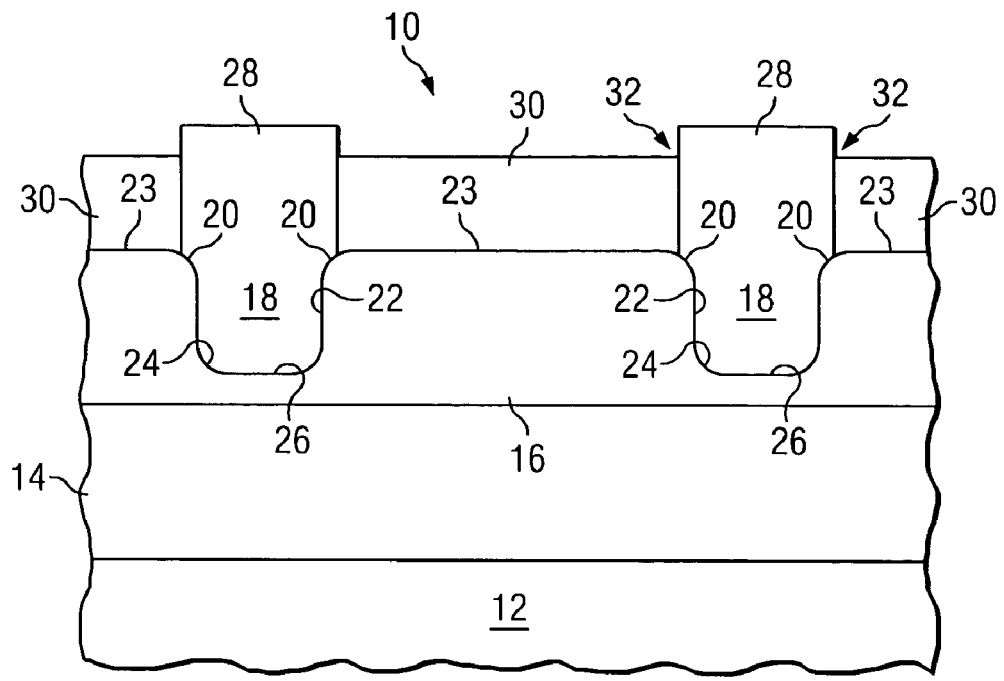
FIG. 1a is a sectioned elevation of a semiconductor structure according to the principles of the present invention and having an unfaceted top layer.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A preferred embodiment of the present invention includes a semiconductor substrate, which may be a semiconductor body or a semiconductor stratum on a subjacent body. A preferred material of the semiconductor substrate is silicon. A first epitaxial crystalline layer is formed, as by deposition, on a free surface of the substrate. The first layer is preferably Si, Ge, C or a compound semiconductor, such as SiGe. In addition, it is preferred that the first layer be Si-rich or Ge-rich. The first layer may be produced by a multi-step deposition process in a single chamber or by multi-chamber deposition. Suitable deposition techniques include molecular beam epitaxy ("MBE") or chemical vapor deposition ("CVD"). Preferred CVD procedures include metal-organic CVD ("MOCVD"), ultra-high vacuum CVD ("UHVCVD") and atomic layer CVD ("ALCVD"). In some embodiments, the first layer is planarized, as by CMP.

In preferred embodiments, deposition of the first layer is effected at temperatures within the range of about 450 C to about 950 C. Preferred forming gases used for deposition of the first layer include $SiH_4$, $Si_2H_6$, $SiH_2Cl_2$, $GeH_4$, $Ge_2H_6$, H, N, HCl, He, $PH_3$ and $B_2H_6$, and these gases may contain Si, Ge, H, Cl, He, P, B and As. Deposition is preferably carried out at pressures less than about 100 mTorr. It is preferred that the crystalline lattice of the first layer is mismatched with the crystalline lattice of the substrate. In some embodiments, the deposited first layer may be annealed in H, N, He, Ne, Ar, Xe, or a mixture thereof at pressures within a range of about 10 to about 1,000 Torr and at temperatures within the range of about 500 C to 1150 C, preferably more than about 100 C higher than the deposition temperature, and the free surface of the annealed first layer may thereafter be planarized, as by CMP.

In preferred embodiments, a second epitaxial crystalline layer is formed on the free surface of the first layer. The materials of the second layer and the method of its formation are the same as in the case of the first layer. Preferably, the crystalline lattice of the second layer is also mismatched with the crystalline lattice of the substrate by an amount no less than the mismatch between the lattices of the substrate and the first layer. Further, it is preferred that there is an increasing amount of lattice mismatch between the first layer and the substrate from the lower interface between the first layer and the substrate to the upper surface of the first layer.

A trench is formed in the second layer by conventional techniques, such as STI, pursuant to which a nearly vertical trench sidewall angle of about 75° to about 90° may be achieved. In some embodiments, the trench is formed to a depth of about 6,000 Å or less in the second layer. Following trench formation, the intersection of the vertical sidewall of the trench and the free surface of the second layer, on the one hand, and the intersection of the trench sidewall and the bottom of the trench, on the other hand, defines respective upper and lower sharp corners. As is known and as discussed above, because the trench will serve as electrical isolation between one strained channel transistor and other nearby transistors, such sharp corners have a deleterious effect on the trench's isolation capabilities. After the trench is formed, the second layer is heat-treated. It has been found that heat treating the second layer and trench in a gaseous ambient containing O, H, N, He, Ne, Ar, Xe or mixtures thereof, at pressures of about 10 to about 1,000 Torr at temperatures of about 500 C to about 1150 C rounds these corners, the rounded corners having radii of about 5 to about 50 nm. Such corners ameliorate, if not eliminate, the deleterious effects of sharp trench corners, as disclosed in the patent documents noted earlier regarding this topic.

The trench is filled by conventional techniques with a dielectric or electrically insulative material, preferably one containing silicon, such as an oxide of silicon. The trench fill material above the free surface of the second layer may be planarized, preferably by CMP. As a consequence, the trench fill is adjacent to and conforms to the rounded contours of the rounded trench corners.

Atop the free surface of the second layer resides a top layer, which may be formed in a similar manner and under similar conditions to those pertaining to the first and second layers. In preferred embodiments, the top layer is silicon-rich or is silicon and to that end is deposited by appropriate selective or non-selective epitaxial techniques. In preferred embodiments, the top layer is about 250 Å or less thick. The crystal lattice of the top layer is preferably mismatched with the crystal lattice of the second layer by an amount no less than the crystalline lattice mismatch between the second and first layers. The top layer may be unfaceted, i.e., its side and the facing side of the trench fill material may engage without a gap therebetween, such as illustrated in FIG. 1a. Alternatively, the top layer may be faceted, in which event there is a gap between the facing sides, such as illustrated in FIG. 1b.

In some embodiments, the top layer may be deposited on the first layer without the intervening second layer. In this event the trench is formed in the first layer, which is otherwise processed as described above with reference to the second layer. The processing of the top layer is as described above. The corners of the trench in the first layer are rounded in the same manner as in the case of the corners of the trench in the second layer.

Figure 1B:
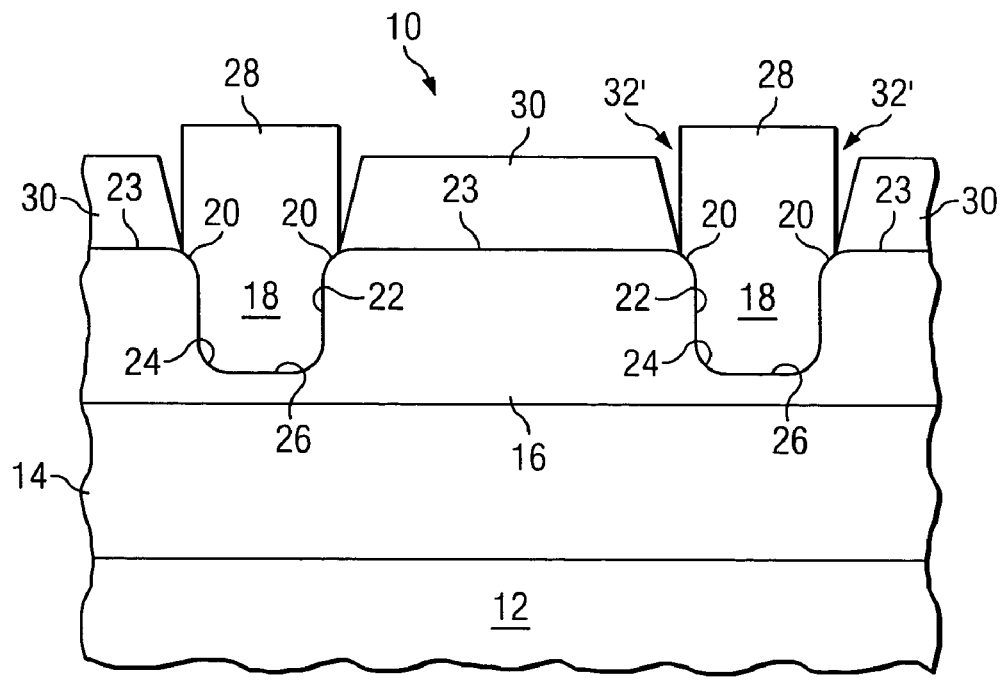
FIG. 1b is a sectioned elevation of a semiconductor structure according to the principles of the present invention and having a faceted top layer.

A preferred embodiment of a semiconductor structure 10 according to the present invention is depicted in FIGS. 1a and 1b. The structure 10 includes a semiconductor substrate 12. The substrate 12 may comprise a semiconductor body or may comprise a semiconductor stratum on a subjacent body (not shown). A preferred material for the substrate is silicon.

A first epitaxial crystalline layer 14 is formed on a free surface of the substrate 12. The free surface of the first layer 14 may be annealed and planarized by CMP or other functional techniques. The crystalline lattice of the first layer 14 is mismatched with the lattice of the substrate 12. A second epitaxial crystalline layer 16 is formed on the free surface of the first layer 14. The crystalline lattice of the second layer 16 is mismatched with the lattice of the first layer 14. Preferably, there is an increasing amount of lattice mismatch between the layer 14 and the substrate 12 as viewed from the lower interface between the layers 14 and 16 toward the upper surface of the layer 14.

A trench 18 is formed in the second layer 16. Preferably the trench 18 is formed by conventional shallow trench isolation ("STI") techniques to a depth of less than about 6,000 Å in the second layer 16. The intersection 20 of the sidewall 22 of the trench 18 and the free surface 23 of the second layer 16 is rounded, having a radius of from about 5 to about 50 nm. In addition, the intersection 24 between the sidewall 22 of the trench 18 and the bottom 26 thereof is also preferably rounded to the same degree. The foregoing round corners 20,24 ameliorate or eliminate problems created by the presence of sharp corners, as discussed earlier.

The trench is filled with a dielectric, electrically insulative material or STI 28 that is adjacent to and conforms to the round corners 20,24. The insulative material 28 or STI 28 may, as shown in FIGS. 1a and 1b, be deposited by conventional techniques that result in its extending above the free surface of the second layer 16.

A top layer 30 is formed on the free surface 23 of the second layer 16. The crystal lattice of the top layer 30 is mismatched with that of the second layer 16. Preferably, the degree of this mismatch is no less than the crystalline lattice mismatch between the second layer 16 and the first layer 14. Accordingly, the top layer 30 is highly strained and is eminently suitable for the formation thereon and therein of a strained channel transistor, such as a MOSFET. Moreover, the rounded corners 20,24 reduce or eliminate deleterious field effects that might otherwise be present if these corners were sharp. There may be engagement, as shown at 32, between the facing sides of the top layer 30 and the insulative material 28, in which event the top layer 30 is said to be unfaceted, per FIG. 1a. Alternatively, as shown in FIG. 1b, the top layer 30 may be faceted with a gap 32' between the facing sides. Faceting is a byproduct of epi growth that occurs near the boundary of a selective epi region (where a <111> surface is formed). If desired, this phenomenum can be suppressed by adjusting the gas ratio, gas component and/or process pressure/temp during formation.

Figure 2:
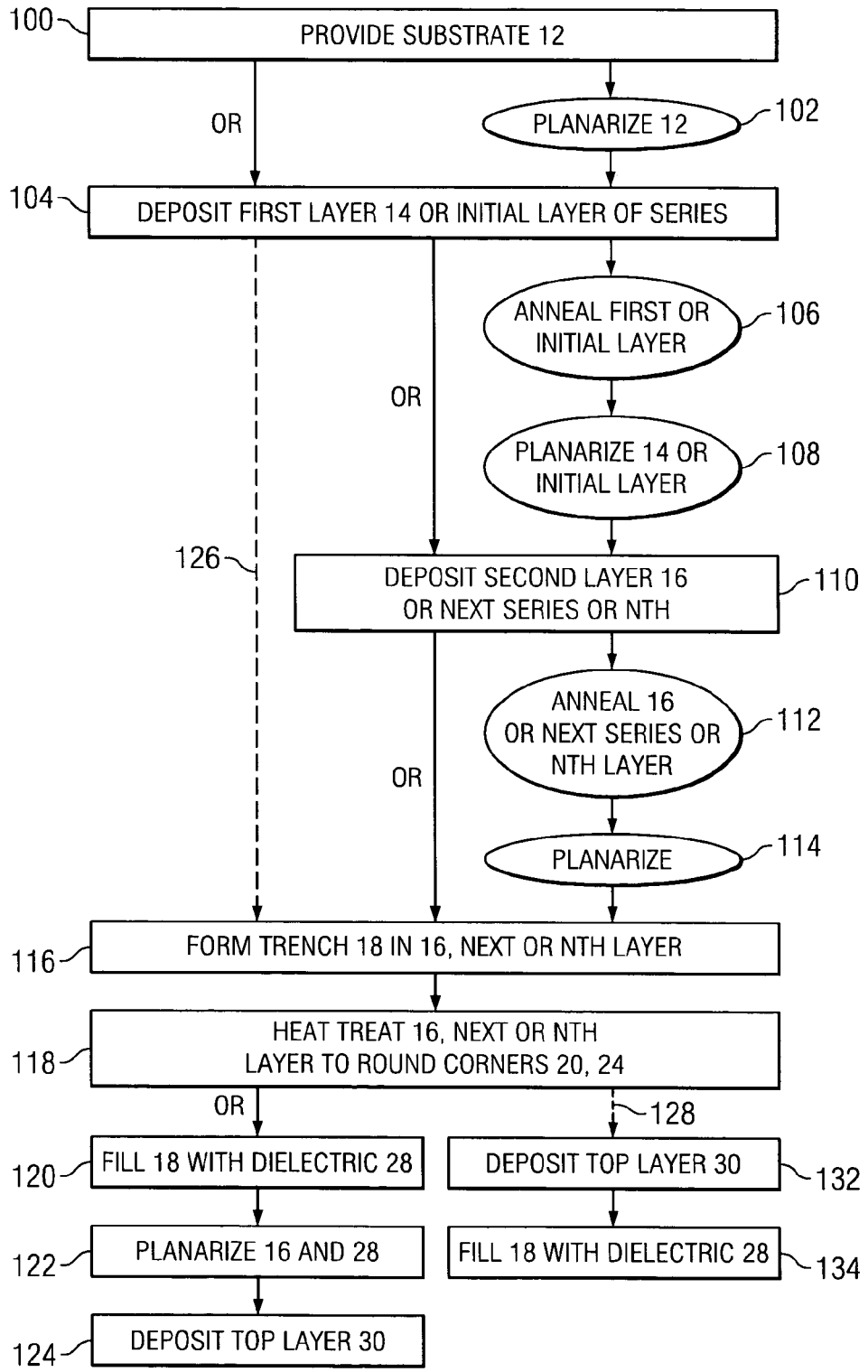
FIG. 2 is a flow chart of the method of making the structure of FIG. 1a and/or FIG. 1b.

FIG. 2 depicts a method of making the structure 10 of FIG. 1. Preferred steps of the method are denoted within rectangular outlines, while optional steps are enclosed within circular outlines.

In step 100 the substrate 12 is provided. The substrate 12 may optionally be planarized, as by CMP, optional step 102.

In step 104 the first epitaxial crystalline layer 14 is deposited or otherwise formed on the free surface of the substrate 12. The first layer 14 may optionally be annealed, step 106 and planarized, step 108, as by CMP. The first layer 14 is preferably Si, Ge, C or a compound semiconductor, such as SiGe. In addition, it is preferred that the first layer 14 be Si-rich or Ge-rich. The first layer 14 may be produced by a multi-step deposition process in a single chamber or by multi-chamber deposition. Suitable deposition techniques include molecular beam epitaxy ("MBE") or chemical vapor deposition ("CVD"). Preferred CVD procedures include metal-organic CVD ("MOCVD"), ultra-high vacuum CVD ("UHVCVD") and atomic layer CVD ("ALCVD"). In preferred embodiments, deposition of the first layer is effected at temperatures within the range of about 450 C to about 950 C. Preferred forming gases used for deposition of the first layer include $SiH_4$, $Si_2H_6$, $SiH_2Cl_2$, $GeH_4$, $Ge_2H_6$, H, N, HCl, He, $PH_3$ and $B_2H_6$, and these gases may contain Si, Ge, H, Cl, He, P, B and As. Deposition is preferably carried out at pressures at or less than about 100 mTorr.

It is preferred that the crystalline lattice of the first layer 14 is mismatched with the crystalline lattice of the substrate 12. In some embodiments the deposited first layer 14 may be annealed, optional step 106, in H, N, He, Ne, Ar, Xe, or a mixture thereof at pressures within a range of about 10 to about 1,000 Torr and at temperatures within the range of about 500 C to 1150 C, preferably more than about 100 C higher than the deposition temperature, and the free surface of the annealed first layer 14 may thereafter be planarized, as by CMP, optional step 108.

In step 110, the second layer 16 is formed. In preferred embodiments, the second layer 16 is an epitaxial crystalline layer formed on the free surface of the first layer 14. The materials of the second layer 16 and the method of its formation are preferably the same as in the case of the first layer 14. Preferably, the crystalline lattice of the second layer 16 is also mismatched with the crystalline lattice of the substrate 12 by an amount no less than the mismatch between the lattices of the substrate 12 and the first layer 14. Further, it is preferred that there is an increasing amount of lattice mismatch between the first layer 14 and the substrate 12 from the lower interface between the first layer 14 and the substrate 12 to the upper surface of the first layer 14. Optional steps 112 and 114 are the same as optional steps 106 and 108, respectively.

In step 116, the trench 18 is formed in the second layer 16 by conventional techniques, such as STI, pursuant to which the sidewall 22 thereof is nearly vertical (having an angle of about 75° to about 90° between the sidewall 22 and either the free surface 23 of the layer 16 or the trench bottom 26). The trench 18 may be formed to a depth of about 6,000 Å or less in the second layer 16. Following trench formation, the intersection of the vertical sidewall 22 of the trench 18 and the free surface of the second layer 16, on the one hand, and the intersection of the trench sidewall 22 and the bottom 26 of the trench 18, on the other hand, defines respective upper and lower sharp corners. As is known and as discussed above, because the trench 16 will serve as electrical isolation between one strained channel transistor and other nearby transistors, such sharp corners have a deleterious effect on the isolation capabilities of the trench 18.

After the trench 18 is formed, the second layer 16 is heat-treated, step 118. It has been found that heat treating the second layer and trench in a gaseous ambient containing O, H, N, He, Ne, Ar, Xe or mixtures thereof, at pressures of about 10 to about 1,000 Torr, at temperatures of about 500 C to about 1150 C rounds the sharp corners, the rounded corners 20 and 24 having radii of about 5 to about 50 nm.

Such rounded corners 20 and 24 ameliorate, if not eliminate, the deleterious effects of sharp trench corners, as noted earlier.

In step 120, the trench 18 is filled by conventional techniques with a dielectric or electrically insulative material 28, preferably one containing silicon, such as an oxide of silicon. The trench fill material 28 above the plane of the free surface of the second layer 16 may be planarized, preferably by CMP, step 122. As a consequence of the foregoing, the trench fill 28 is adjacent to and conforms to the rounded contours of the rounded trench corners 20 and 24.

In step 124, the top layer 30 is deposited on the free surface of the second layer 16. The top layer 30 may be formed in a similar manner and under similar conditions to those pertaining to the first and second layers. In preferred embodiments, the top layer 30 is silicon-rich or is silicon and to that end is deposited by appropriate selective or non-selective epitaxial techniques. In preferred embodiments, the top layer 30 is about 250 Å or less thick. The crystal lattice of the top layer 30 is preferably mismatched with the crystal lattice of the second layer 16 by an amount no less than the crystal lattice mismatch between the second and first layers 16,14.

In some embodiments, the top layer 30 may be deposited on the first layer 14 without the intervening second layer 16. In this event steps 106, 108, 110, 112 and 114 are eliminated, and the trench 18 is formed in the first layer 14 by step 116, as indicated by an arrow-headed broken line 126. Thereafter the first layer 14 is subjected to steps 118, 120, 122 and 124.

Alternatively, after the trench 18 is formed in the second layer 16, or in the first layer 14 if the second layer is not utilized (either according to step 116), the round corners are produced by step 118. Thereafter, following an alternate path indicated by an arrow-headed broken line 128, the top layer 30 is deposited on the free surface of the layer 14 or 16, step 132. Then the trench 18 is filled with dielectric material, step 134.

In general terms, the structure 10 may have a series of N layers similar to the layers 14 and 16. N can be 1, 2 or more. The trench 18 is formed in the Nth layer, as in step 116, and the Nth layer is then subjected to the heat treatment of step 118 to produce the rounded corners 20 and 24. Thereafter, the structure 10 may be completed by sequentially performing steps 120, 122 and 124, or, alternatively, steps 132 and 134.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure from which a strained channel transistor may be fabricated, comprising:
    a semiconductor substrate;
    a first crystalline layer on the substrate, wherein the first crystalline layer and the substrate have a first lattice mismatch;
    a second crystalline layer on the first crystalline layer, wherein the second crystalline layer and first crystalline layer have a second lattice mismatch, the second lattice mismatch being greater than the first lattice mismatch;
    a trench formed in the second crystalline layer; and
    a top epitaxial layer on the second crystalline layer, wherein the top epitaxial layer and the second crystalline layer have a third lattice mismatch, the third lattice mismatch being greater than the second lattice mismatch.

2. A semiconductor structure as in claim 1, wherein upper and lower corners of the trench are rounded.

3. A semiconductor structure as in claim 1 wherein upper corners of the trench are rounded.

4. A semiconductor structure as in claim 2, wherein the radii of the corners are from about 5 to about 50 nm.

5. A semiconductor structure as in claim 1, wherein the trench has a depth of about 6,000 Å or less.

6. A semiconductor structure as in claim 2, wherein the rounded corners are formed by beating the second layer in a gaseous ambient.

7. A semiconductor structure as in claim 6, wherein heating is effected at a temperature within the range of about 700 C to about 950 C.

8. A semiconductor structure as in claim 6, wherein the gaseous ambient includes O, H, N, He, Ne, Ar, Xe or a combination thereof.

9. A semiconductor structure as in claim 6, wherein heating is effected at a pressure within the range of about 10 to about 1,000 Torr.

10. A semiconductor structure as in claim 1, wherein the trench contains an insulative material comprising silicon oxide.

11. A semiconductor structure as in claim 1, wherein the top layer is less than about 250 Å thick.

12. A semiconductor structure as in claim 1, wherein the first, second and top layers comprise Si, Ge, C, or a compound semiconductor.

13. A semiconductor structure as in claim 1, wherein the first, second and top layers comprise Si and Ge.

14. A semiconductor structure as in claim 1, wherein a free surface of one or more of the layers is planarized before a next superjacent layer is present thereon.

15. A semiconductor structure as in claim 14, wherein planarization is effected by CMP.

* * * * *